(12) United States Patent
Shepston

(10) Patent No.: US 6,181,185 B1
(45) Date of Patent: Jan. 30, 2001

(54) LOW MISMATCH COMPLEMENTARY CLOCK GENERATOR

(75) Inventor: Shad R. Shepston, Firestone, CO (US)

(73) Assignee: Agilent Technologies, Palo Alto, CA (US)

(*) Notice: Under 35 U.S.C. 154(b), the term of this patent shall be extended for 0 days.

(21) Appl. No.: 09/357,340

(22) Filed: Jul. 14, 1999

(51) Int. Cl.[7] .................................................. H03K 3/00
(52) U.S. Cl. ........................ 327/295; 327/170; 327/277; 327/291
(58) Field of Search ................................ 327/170, 171, 327/256, 258, 259, 277, 281, 291, 294, 295, 298, 299

(56) References Cited

U.S. PATENT DOCUMENTS

| | | | |
|---|---|---|---|
| 4,899,071 | * | 2/1990 | Morales ............................ 327/277 |
| 5,231,319 | * | 7/1993 | Crafts et al. .................... 327/277 |

* cited by examiner

Primary Examiner—Timothy P. Callahan
Assistant Examiner—An T. Luu
(74) Attorney, Agent, or Firm—Alexander J Neudeck

(57) ABSTRACT

Two complementary clocks that are well matched are produced from a single input clock. A clock buffer includes an alternating series of edge-rate-controlled inverters and level restoring inverters. The output of this series of inverters is compared to the input clock by a race timer. If the output of the series of inverters switches in the opposite direction before the input clock, the edge rates of the series of inverters are slowed down. If the output of the series of inverters switches in the opposite direction after the input clock, the edge rates of the series of inverters are speeded up. The output of the series of inverters eventually approaches the timing of the input clock but complemented. These signals form a pair of complementary clocks with well matched timing.

8 Claims, 2 Drawing Sheets

LOW MISMATCH COMPLEMENTARY CLOCK GENERATOR

FIELD OF THE INVENTION

The present invention relates generally to clock buffer circuits used in integrated circuits, and, more particularly, to a clock buffer circuit for generating a complementary clock signal from a single-ended clock signal.

BACKGROUND OF THE INVENTION

The performance of very large scale integration (VLSI) systems has been improved by designing hardware that can handle greater clock frequencies. Since pipelined data processing systems generally use clocks which are generally a pair of differential symmetric clocks generated by a centralized clocking circuit, the skew and the rise/fall times of the clocking signals need to be well controlled. If the skew is large, slow or mismatched clock signals can result. This causes errors in the pipeline. Such errors are herein referred to as clock signal races and may be characterized by pipeline situations in which data in one stage "sneaks" through to a subsequent stage before the proper clocking signal is received. These "sneaks" cause lost data.

Top prevent these errors, conventional techniques may use differential clock signals in which one clock signal has a rising edge which occurs after a falling edge of the other clock signal and a falling edge which occurs before a rising edge of the other clock signal. Such signals prevent clock signal races in a pipelined circuit by deactivating a subsequent stage before data is allowed to propagate through the current stage. While such a clocking system prevents data from "sneaking" through to the next stage, it does so at significant performance cost due to the "dead" time between clock edges.

Global overlapping clocks may provide timing advantages with respect to non-overlapping clocks in that there is no dead time between a falling edge of one clock signal and the rising edge of the other clock signal. As a result, early clock edges may be received which allow improved system performance of the pipelined circuits. Global overlapping clocks may be easier to distribute to the circuitry without closely controlling the clock skew caused by time/phase shifts. However, as just noted, if the clock skew is large, race conditions may be created which may cause information to be lost when only global overlapping clocks are used for clocking the pipelined circuits. Furthermore, global overlapping clocks require the distribution of two clock signals. The distribution of two signals instead of one requires extra resources. Finally, the clock skew caused by time/phase shifts of the global overlapping clocks increases the amount of dead time necessary. As the dead time increases, it reduces the amount of time available for other circuitry to do its job. This cuts performance.

SUMMARY OF THE INVENTION

A preferred embodiment of the invention provides two complementary clocks that are well matched from a single input clock. These well-matched clocks help prevent clock race conditions. A single input clock requires fewer resources to distribute globally.

An embodiment of a clock buffer according to the present invention includes an alternating series of edge-rate-controlled inverters and level restoring inverters. The output of this series of inverters is compared to the input clock by a race timer. If the output of the series of inverters switches in the opposite direction before the input clock, the edge rates of the series of inverters are slowed down. If the output of the series of inverters switches in the opposite direction after the input clock, the edge rates of the series of inverters are speeded up. Accordingly, the output of the series of inverters eventually approaches the timing of input clock but complemented. These signals are then optionally buffered and inverted one more time to produce a pair of complementary clocks with well matched timing and appropriately strong drive capability.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
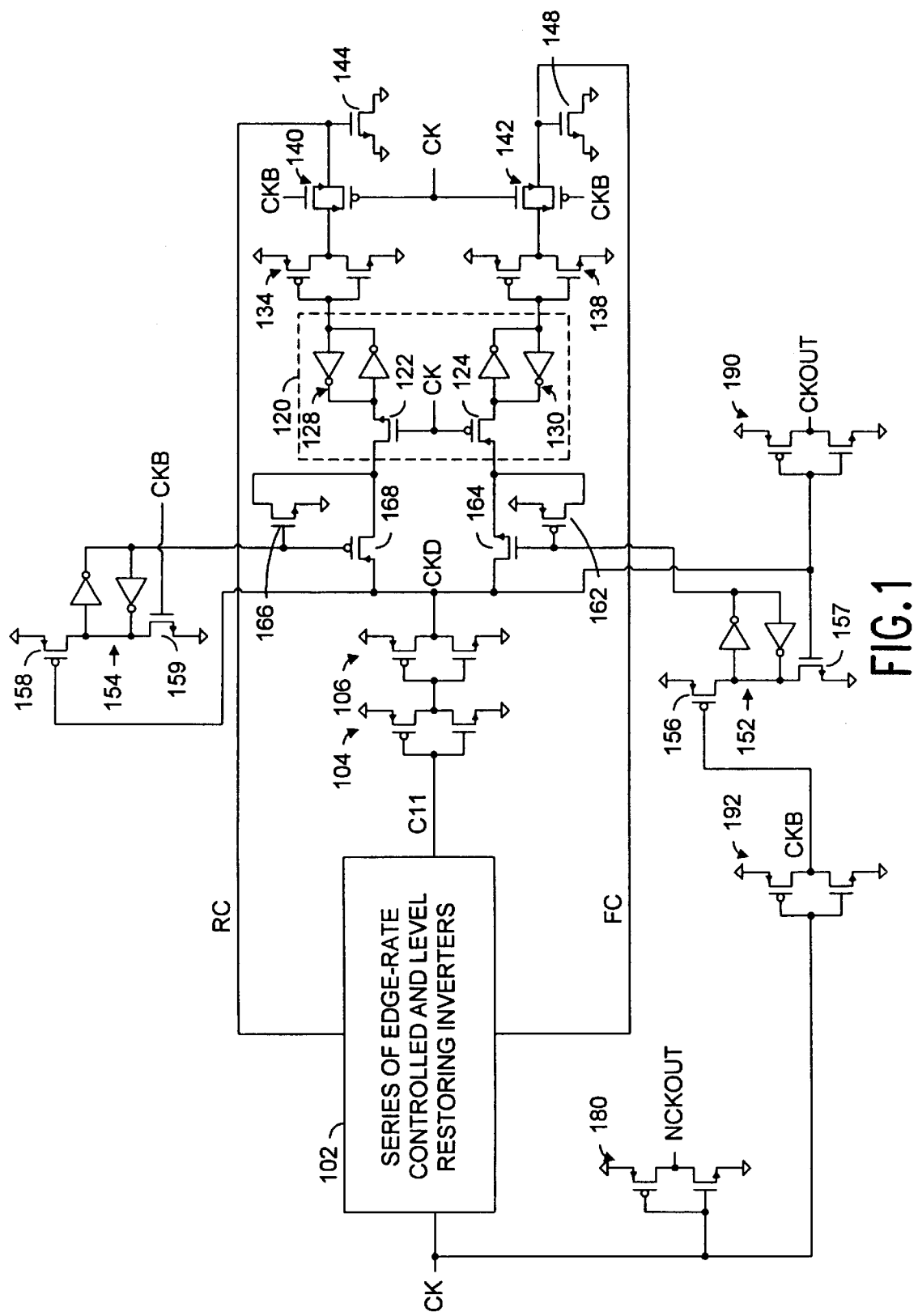
FIG. 1 is a schematic illustration of a low mismatch complementary clock generator.

FIG. 1 is a schematic illustration of a low mismatch complementary clock generator. A single-ended clock signal, CK, is the input to the clock generator. A pair of signals, CKOUT and NCKOUT, are the outputs of the clock generator. These signals are well matched. Being well-matched means that as one signal switches in one direction (i.e. from a logical high to a logical low) the other signal switches nearly simultaneously in the other direction. The result of this is that there is little or no overlap between these complementary signals. Overlap between complementary signals is a period of time when both signals are at the same logical level.

Figure 2:
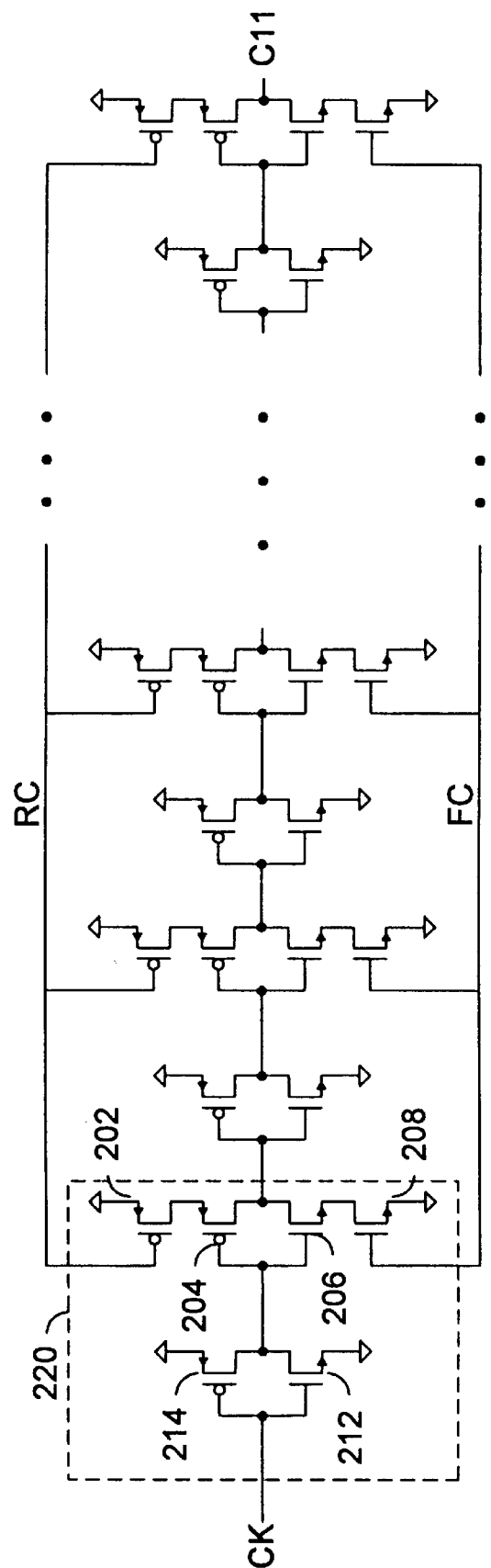
FIG. 2 is a schematic illustration of an alternating series of edge rate controlled inverters and level restoring inverters.

CK is input to an alternating series of edge-rate-controlled inverters and level restoring inverters 102 and inverter 192. The alternating series of edge-rate-controlled inverters and level-restoring inverters 102 of the preferred embodiment is illustrated in FIG. 2. Input signals RC (rise control) and FC (fall control) control the edge rates of the edge rate controlled inverters in 102.

In FIG. 2 a single stage containing one level restoring inverter and one edge-rate-controlled inverter is shown inside box 220. P-channel field effect transistor (PFET) 214 and n-channel field effect transistor (NFET) 212 are arranged as a CMOS inverter and their sizes chosen such that they comprise a level restoring inverter. PFETs 202 and 204 and NFETs 206 and 208 comprise an edge-rate controlled inverter. The source of PFET 202 is connected to the positive supply voltage, VDD. The gate of PFET 202 is connected to the rise control input signal RC. The drain of PFET 202 is connected to the source of PFET 204. The gate of PFET 202 is connected to the output of the level restoring inverter formed with transistors 214 and 212. The drain of PFET 204 is connected to the output of this stage. The output of this stage is connected to the input of the level-restoring inverter of the next stage, or the output of the series if this was the last stage. The output of this stage is also connected to the drain of NFET 206. The gate of NFET 206 is connected to the output of the level restoring inverter formed with transistors 214 and 212. The source of NFET 206 is connected to the drain of NFET 208. The gate of NFET 208 is connected to the fall control input signal FC. The source of NFET 208 is connected to the negative supply voltage, GND. Together, the level restoring inverter comprised of transistors 212 and 214 and the edge-rate controlled inverter comprised of transistors 202, 204, 206, and 208 comprise one stage of the alternating series of edge-rate controlled inverters and level restoring inverters. The output of all the stages of the alternating series of edge-rate-controlled inverters and level-restoring inverters is signal C11 whose rising edge is delayed from the rising edge of CK by an amount controlled by the signal RC and whose falling edge is delayed from the falling edge of CK by an amount controlled by signal FC. In the preferred embodiment, there are six of these stages cascaded in series. However, one of ordinary skill in the art would recognize that a larger or smaller number of stages could be used depending upon the desired operating frequency of the CK signal and the operating characteristics of the FETs.

Referring back to FIG. 1, the output of 102 is signal C11. Signal C11 is connected to the input of inverter 104. Since the last stage of 102 is an edge-rate controlled inverter, inverter 104 functions as a level restoring inverter. The output of inverter 104 is connected to the input of inverter 106. The output of inverter 106 is signal CKD. Inverters 104 and 106 function to level restore and increase the drive capability of the output of 102 generating a well driven signal with good edge rates, CKD.

During normal operation, CKD is passed through pass transistors 168 and 164 to race timer 120. The outputs of pass transistors 168 and 164 are connected to the inputs to race timer 120 which are the drain of NFET 122 and the source of PFET 124, respectively. Pass transistor 168 is a PFET transistor that is on during normal operation. The source of pass transistor 168 is connected to CKD. The gate of 168 is connected to the output of latch 154 and the gate of NFET transistor 166. The drain of 168 is connected to the drain of 166 and the drain of NFET 122. The source of NFET 166 is connected to the negative supply voltage. The drain of pass transistor 164 is connected to CKD. The gate of 164 is connected to the output of latch 152 and the gate of PFET transistor 162. The source of 164 is connected to the drain of 162 and the source of PFET 124. The source of PFET 162 is connected to the positive supply voltage.

The gate of NFET 122 is connected to CK. The gate of PFET 124 is connected to CK. CK is the input clock signal. The source of 122 is connected to the input of latch 128 so that the value on the drain of 122 is latched into latch 128 with the falling edge of CK. The drain of 124 is connected to the input of latch 130 so that the value on the source of 124 is latched into latch 130 with the rising edge of CK.

NFET 122 functions to compare the timing of the falling edge of CK to the rising edge of CKD. If CKD rises before 122 is turned off by the falling edge of CK, a high is latched into latch 128. This manifests itself as a low on the output of latch 128. This low is inverted by inverter 134 to produce a high on the output of inverter 134. If CKD rises after 122 is turned off by the falling edge of CK, a low is latched into latch 128. This manifests itself as a high on the output of latch 128. This high is inverted by inverter 134 to produce a low on the output of inverter 134.

The output of 134 is connected to the input terminal of CMOS pass gate 140. The gate of the NFET in CMOS pass gate 140 is connected to CKB. The gate of the PFET in CMOS pass gate 140 is connected to CK. Accordingly, CMOS pass gate 140 passes the value on the output of inverter 134 to its output when CK is low and CKB is high. The output of CMOS pass gate 140 is connected to the gate of NFET transistor 144. The source and drain of transistor 144 are connected to the negative supply voltage so that 144 functions as a capacitor. The sizes of the transistors in pass gate 140 are chosen such that pass gate 140, when on, has a relatively high resistance. In addition, transistor 144 is chosen to be very large so that it forms a relatively large capacitance. Together, the high resistance of pass gate 140 and the high capacitance of transistor 144 function as a low-pass filter. The result of this low-pass filtering, is the voltage on the gate of transistor 144 that is rise control signal RC.

To summarize how RC is generated, when CKD rises before CK falls, a high is latched into latch 128. This causes a high on the output of inverter 134 that causes a gradual increase in the level of RC. The increase is gradual because pass gate 140 is highly resistive and transistor 144 is highly capacitive. As RC rises, it slows the rising edges of the edge-rate-controlled inverters inside 102. This causes the rising edge of CKD to arrive later.

When CKD rises after CK falls, a low is latched into latch 128. This causes a low on the output of inverter 134 that causes a gradual decrease in the level of RC. The decrease is gradual because pass gate 140 is highly resistive and transistor 144 is highly capacitive. As RC falls, it speeds up the rising edges of the edge-rate-controlled inverters inside 102. This causes the rising edge of CKD to arrive sooner. Eventually, equilibrium is reached where CKD is rising at nearly the same time that CK falls.

NFET 124 functions to compare the timing of the rising edge of CK to the falling edge of CKD. If CKD falls before 124 is turned off by the rising edge of CKB, a low is latched into latch 130. This manifests itself as a high on the output of latch 130. This high is inverted by inverter 138 to produce a low on the output of inverter 138. If CKD falls after 124 is turned off by the rising edge of CK, a high is latched into latch 130. This manifests itself as a low on the output of latch 130. This low is inverted by inverter 138 to produce a high on the output of inverter 138.

The output of 138 is connected to the input terminal of CMOS pass gate 142. The gate of the PFET in CMOS pass gate 142 is connected to CKB. The gate of the NFET in CMOS pass gate 142 is connected to CK. Accordingly, CMOS pass gate 142 passes the value on the output of inverter 138 to its output when CK is high and CKB is low. The output of CMOS pass gate 142 is connected to the gate of NFET transistor 148. The source and drain of transistor 148 are connected to the negative supply voltage so that 148 functions as a capacitor. The sizes of the transistors in pass gate 142 are chosen such that pass gate 142, when on, has a relatively high resistance. In addition, transistor 148 is chosen to be very large so that it forms a relatively large capacitance. Together, the high resistance of pass gate 142 and the high capacitance of transistor 148 function as an low-pass filter. The result of this low-pass filtering, the voltage on the gate of transistor 148, is fall control signal FC.

To summarize how FC is generated, when CKD falls before CK rises, a low is latched into latch 130. This causes a low on the output of inverter 138 that causes a gradual decrease in the level of FC. The decrease is gradual because pass gate 142 is highly resistive and transistor 148 is highly capacitive. As FC falls, it slows the falling edges of the edge-rate-controlled inverters inside 102. This causes the falling edge of CKD to arrive later.

When CKD falls after CK rises, a high is latched into latch 130. This causes a high on the output of inverter 138 that causes a gradual increase in the level of FC. The increase is gradual because pass gate 142 is highly resistive and transistor 148 is highly capacitive. As RC rises, it speeds up the falling edges of the edge-rate-controlled inverters inside 102. This causes the falling edge of CKD to arrive sooner. Eventually, equilibrium is reached where CKD are falls at nearly the same time that CK rises. When equilibrium is reached for the entire system, the rising edge of CKD will correspond closely in time to the falling edge of CK. In addition, the falling edge of CKD will correspond closely in time to the rising edge of CK.

If RC or FC were to initially be a strong high level or a strong low level respectively at power-up, then it would effectively prevent the rising, falling, or both edges from propagating through 102 sticking CKD at one value. Thus, race timer 120 would have no edges on CKD to compare to the edges of CK.

If CKD is stuck high, then PFET 158 would be off The gate of PFET 158 is connected to CKD. The source of PFET 158 is connected to the positive supply. The drain of PFET 158 is connected to the input of latch 154. Also connected to the input of latch 154 is the drain NFET 159. The source of NFET 159 is connected to the negative supply. The gate of NFET 159 is connected to CKB. CKB is an inverted version of the input clock signal generated by inverter 192. Thus, if CKD is stuck high, and CKB goes high, the output of latch 154 goes high. This shuts off pass gate 168 and turns on NFET 166. This forces a low on the drain of NFET 122. This state is passed along by race timer 120, inverter 134, and pass gate 140 to draw RC lower until a falling edge occurs on CKD. When a falling edge occurs on CKD, the output of latch 154 goes low. This shuts off NFET 166 and turns on PFET 168 so race timer 120 can compare the rising edges of CKD to the falling edges of CK.

If CKD is stuck low, then NFET 157 would be off. The gate of NFET 157 is connected to CKD. The source of NFET 157 is connected to the negative supply. The drain of NFET 157 is connected to the input of latch 152. Also connected to the input of latch 152 is the drain PFET 156. The source of PFET 156 is connected to the positive supply. The gate of PFET 156 is connected to CKB. If CKD is stuck low, and CKB goes low, the output of latch 152 goes low. This shuts off pass gate 164 and turns on PFET 162. This forces a high on the source of PFET 124. This state is passed along by race timer 120, inverter 138, and pass gate 142 to draw FC higher until a rising edge occurs on CKD. When a rising edge occurs on CKD, the output of latch 152 goes high. This shuts off PFET 162 and turns on NFET 164 so race timer 120 can compare the falling edges of CKD to the rising edges of CK.

In the preferred embodiment, CKD and CK are output as well-matched complementary clocks. In an alternate embodiment, CKD is inverted by inverter 190 to produce signal CKOUT. CK is buffered by inverter 180 to produce signal NCKOUT. Since inverters 190 and 180 are the same size, the delays through inverter 190 and 180 should be the same. Thus, since CK and CKD are well-matched complements of each other, CKOUT and NCKOUT are well-matched complements of each other.

Referring to FIG. 1, the FET sizing for the NFETs and PFETs in the preferred embodiment is shown in TABLE A.

TABLE A

| FET | SIZE (width/length) |
|-----|---------------------|
| 122 | 4 |
| 124 | 8 |
| 144 | 1000 |
| 148 | 1000 |
| 156 | 4 |
| 157 | 2 |
| 158 | 4 |
| 159 | 2 |
| 164 | 4 |
| 168 | 8 |

Also referring to FIG. 1 the FET sizing for the NFETs and PFETs in the inverter of the preferred embodiment is shown in TABLE B.

TABLE B

| Inverter | PFET size (width/length) | NFET size (width/length) |
|----------|--------------------------|--------------------------|
| 104 | 2 | 1 |
| 106 | 8 | 4 |
| 134 | 2 | 1 |
| 138 | 2 | 1 |
| 180 | 32 | 16 |
| 190 | 32 | 16 |
| 192 | 8 | 4 |

In the preferred embodiment latches 124, 128, 152, 154 of FIG. 1 have a feed-forward forward inverter PFET with a W/L ration of 8 and a feed-forward inverter NFET with a W/L ratio of 4. These latches also feed-back inverter PFET with a W/L ration of 1 and a feed-back inverter NFET with a W/L ratio of 1.

Referring to FIG. 2, the FET sizing for the NFETs and PFETs in the preferred embodiment is shown in TABLE C.

TABLE C

| FET | SIZE (width/length) |
|-----|---------------------|
| 202 | 2 |
| 204 | ½ |
| 206 | ¼ |
| 208 | 1 |
| 212 | 1 |
| 214 | 2 |

Although a specific embodiment of the invention has been described and illustrated, the invention is not to be limited to the specific forms or arrangements of parts so described and illustrated. The invention is limited only by the claims.

What is claimed is:

1. A complementary clock generator, comprising:
    a single input clock;
    an alternating series of edge-rate-controlled inverters and level restoring inverters driven by said single input clock and having an output that is an intermediate clock; and,
    a race timer, said race timer having a first output that is coupled to said alternating series of edge-rate-controlled inverters and level restoring inverters that changes the timing of a rising edge of said intermediate clock based upon a comparison of the rising edge of said intermediate clock and the falling edge of said single input clock, said race timer also having a second output that is coupled to said alternating series of edge-rate-controlled inverters and level restoring inverters that changes the timing of a falling edge of said intermediate clock based upon a comparison of the falling edge of said intermediate clock and the rising edge of said single input clock.

2. The complementary clock generator of claim 1 wherein said race timer comprises:

a first latch, said first latch having a first clock input, a first data input, and a first latch output, said first latch output being said first output, and said first clock input being coupled to said single input clock; and, a second latch, said second latch having a second clock input, a second data input, and a second latch output, said second latch output being said second output, and said second clock input being coupled to said single input clock.

3. The complementary clock generator of claim 2 wherein said first data input is coupled to said intermediate clock and said second data input is coupled to said intermediate clock.

4. The complementary clock generator of claim 3 wherein said first output is low-pass filtered and said second output is low-pass filtered.

5. The complementary clock generator of claim 4 further comprising a first startup circuit and a second startup circuit wherein said first startup circuit sets said first data input when said intermediate clock is not switching and said single input clock is switching, and said second startup circuit sets said second data input when said intermediate clock is not switching and said single input clock is switching.

6. The complementary clock generator of claim 5 wherein said intermediate clock is coupled to a first complementary output to produce a first complementary output clock and said single input clock is coupled to a second complementary output to produce a second complementary output clock.

7. The complementary clock generator of claim 6 wherein said first complementary output clock has a first output rising edge and a first output falling edge and said second complementary output clock has a second output rising edge and a second output falling edge and said first output falling edge and said second output rising edge occur are well-matched and said first output rising edge and said second output falling edge are well-matched.

8. A method of generating a complementary clock, comprising:

delaying a rising edge of a single input clock by a first programmable delay to produce a delayed rising edge of an intermediate clock;

delaying a falling edge of said single input clock by a second programmable delay to produce a delayed falling edge of said intermediate clock;

comparing said delayed rising edge of said intermediate clock to said falling edge of said single input clock and adjusting said first programmable delay to match said delayed rising edge of said intermediate clock to said falling edge of said single input clock; and, comparing said delayed falling edge of said intermediate clock to said rising edge of said single input clock and adjusting said second programmable delay to match said delayed falling edge of said intermediate clock to said rising edge of said single input clock.

* * * * *